United States Patent
Aho et al.

(10) Patent No.: US 7,962,242 B1
(45) Date of Patent: Jun. 14, 2011

(54) AUTOMATED SPATIAL FLIPPING APPARATUS AND SYSTEM FOR PHOTOMASKS AND PHOTOMASKS WITH PELLICLES

(75) Inventors: Marc T. Aho, Mountain View, CA (US); Thaddeus J. Wilson, Sunnyvale, CA (US); Jeff Roberts, Port Hueneme, CA (US)

(73) Assignee: n&k Technology Inc., San Jose, CA (US)

( * ) Notice: Subject to any disclaimer, the term of this patent is extended or adjusted under 35 U.S.C. 154(b) by 584 days.

(21) Appl. No.: 12/050,387

(22) Filed: Mar. 18, 2008

(51) Int. Cl.
 *B65G 47/24* (2006.01)
 *B25J 1/00* (2006.01)

(52) U.S. Cl. .................. 700/251; 414/225.01; 901/19; 901/36

(58) Field of Classification Search .............. 700/245, 700/251; 414/939, 225.01, 941; 206/455; 355/72; 901/15, 19, 21, 36, 2; 359/819
See application file for complete search history.

(56) References Cited

U.S. PATENT DOCUMENTS

| | | | |
|---|---|---|---|
| 4,659,172 A | 4/1987 | Cavan | |
| 6,000,902 A | 12/1999 | Mueller et al. | |
| 6,811,370 B2 * | 11/2004 | Buermann | 414/416.03 |
| 7,458,761 B2 * | 12/2008 | Sze et al. | 414/764 |
| 2002/0154285 A1 * | 10/2002 | Ramamoorthy et al. | 355/72 |
| 2007/0187272 A1 * | 8/2007 | Bonness et al. | 206/455 |
| 2008/0041429 A1 * | 2/2008 | Pan | 134/165 |
| 2010/0209826 A1 * | 8/2010 | Kim et al. | 430/5 |
| 2010/0292826 A1 * | 11/2010 | Blattner et al. | 700/109 |

* cited by examiner

*Primary Examiner* — Ronnie Mancho
(74) *Attorney, Agent, or Firm* — Johannes Schneeberger

(57) ABSTRACT

A spatial photomask flipper provides up to four access gates for an unloading of a clamped photomask after its reorientation along a single photomask transfer axis. The clamping frames holding the photomask are secured by a locking control cam that prevents their inadvertent opening in any other but the two main flip orientations. The flipper is part of an automated system including a digital camera and an image recognition algorithm that interpret an arbitrary initial photomask loading orientation from a circumferential photomask identification number. An eventual pellicle on the photomask may be also automatically detected via a pellicle detection sensor. Alternately, the digital camera may be employed for pellicle detection together with a pellicle detection algorithm that processes the digital image for well known components of the pellicle such as the pellicle frame.

37 Claims, 13 Drawing Sheets

VIEW DETAIL A

VIEW DETAIL A

VIEW DETAIL A

AUTOMATED SPATIAL FLIPPING APPARATUS AND SYSTEM FOR PHOTOMASKS AND PHOTOMASKS WITH PELLICLES

FIELD OF INVENTION

The present invention relates to photomask flippers. In particular, the present invention relates to an automated spatial flipping apparatus for photomasks and photomasks with pellicles. In addition, the present invention relates to automated systems for detecting arbitrary initial supply orientation and for spatial reorientation of photomasks and photomasks with pellicles.

BACKGROUND OF INVENTION

The fabrication of photomasks may require optical inspection of top and bottom side of the photomask. Common optical inspection devices to the contrary are configured for single side inspection at an inspection site provided on top of an X-Y stage. This requires a top and bottom side flipping of the photomask between consecutive top and bottom side inspection. To keep time intervals for transfer and top and bottom side flipping to a minimum, there exists a need for a photomask flipper with a minimal footprint to be operated within an immediate vicinity of the inspection site. The present invention addresses this need.

Photomasks are commonly handled within an enclosed environment of the optical inspection device by a robotic arm that transfers the photomasks at least between an external access port and the inspection site. In case of an employed photomask flipper, the robotic arm may transfer the photomasks between the external access port, the flipper and the inspection site. To keep the space requirement for the robotic arm to a minimum, there exists a need for a photomask flipper that may be loaded and unloaded along a single transfer axis and within a single loading plane. The present invention addresses also this need.

Photomasks are commonly transported in well known containers within which they may be stacked in arbitrary initial supply orientation. But to perform optical inspection it is commonly required that the photomask is positioned in a predetermined orientation. Therefore, there exists a need for photomask flipper and system that identifies an arbitrary initial spatial photomask orientation and that automatically spatially reorients the photomask into a predetermined final spatial orientation. The present invention addresses also this need.

Optical inspection devices are desirably configured with a minimum footprint while providing a highly automated functionality. Particularly, automated transfer of the photomasks needs to be provided with a highly compact robotic arm limited to in plane photomask handling. Therefore, there exists a need for a photomask flipper that provides also lifting from and lowering onto the robotic arm of the photomask. The present invention addresses this need.

Photomasks are increasingly configured with well known pellicles. The presence of a pellicle may be initially unknown but may need to be automatically detected such that optical inspection may be eventually automatically adjusted for through-pellicle measurements. The present invention addresses also this need.

SUMMARY

A spatial photomask flipper for rotating a photomask between preferably two flip orientations and between three and four photomask side orientations includes a clamping unit, a link arm connected to the clamping unit via a first motored rotation axis, and a base connected to the link arm via a second motored rotation axis. The two motored rotation axes are in a substantial angle with respect to each other such that the clamping unit may be spatially rotated with respect to a photomask transfer axis. The photomask flipper includes also a clamper control cam that operates in conjunction with one or two cam sliders combined with respective clamping members of the clamping unit. The clamper control unit secures the clamping unit in closed configuration while rotating around the preferably horizontal first motored rotation axis to prevent inadvertent opening of the clamping unit.

The clamping unit features multiple clamping points to hold the photomask at its corners. In between the clamping points are three or four access gates across which the clamped and reoriented photomask may be accessed by the robotic arm while the access gates are rotated via the two motored rotation axis into a transfer access orientation of the flipper. The flipper is positioned with respect to the robotic arm's transfer axis such that the transfer access orientation is aligned with transfer axis.

The clamping unit may be combined with the link arm via the first motored rotation axis in a fashion such that either adjacent clamping point pairs or adjacent access gates are sided opposite the first motored rotation axis in direction towards the link arm. In the first case, the spatial flipper may be dimensioned most compact on the expense of an eventually required reloading of the photomask into the flipper since only three sides of the point clamped photomask are accessible. In the second case, a loaded photomask may be reoriented in a single loading cycle into any of its two flip orientations and into any of its four side orientations irrespective its initial loading orientation.

The spatial photomask flipper may be part of an automated photomask reorienting system including a digital camera and an image processing algorithm such that any initial unknown arbitrary loading orientation of the photomask may be automatically identified and the photomask accordingly reoriented into a predetermined final orientation.

The spatial photomask flipper is capable of handling photomasks having one or two well known pellicles. A pellicle sensor and/or the camera may automatically scan for the eventual presence of a pellicle. The spatial photomask flipper may rotate the photomask with respect to the sensor or camera into a predetermined pellicle scanning orientation in which a photomask side is facing the pellicle sensor and/or the camera. In case of a pellicle being detected, information for pellicle presence may be automatically passed on to the optical inspection device, which may consecutively automatically switch to a predetermined through-pellicle inspection routine.

DETAILED DESCRIPTION

Figure 1:
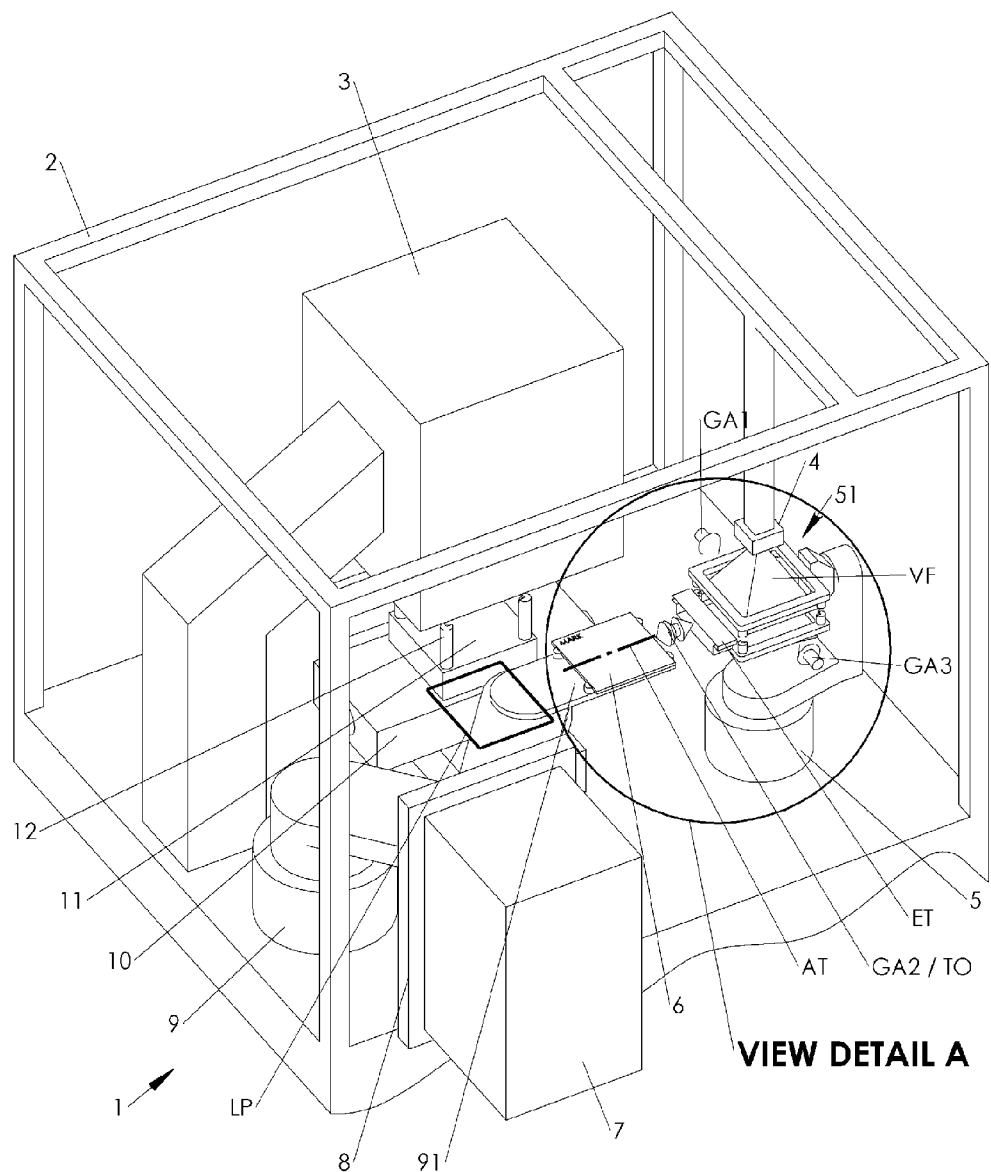
FIG. 1 is a schematic perspective view of a partial representative optical inspection device including a first embodiment of the invention with a circled View Detail A.

Referring to FIG. 1, the present invention is preferably combined and/or integrated in an optical inspection device 1, having well known elements such as a frame 2, a measurement head 3, an external access port 8, a robotic arm 9 and an X-Y stage 10 featuring an inspection site 11 with eventual pin lifters 12. A well known photomask transport container 7 with a number of stacked photomasks 6 may be attached to the optical inspection device 1. The photomasks 6 may be stacked in the transport container 7 in up to eight arbitrary initial supply orientations. The robotic arm 9 has a loader 91 on which the photomasks 6 are transferred preferably two dimensionally and horizontally along a loading plane LP. FIGS. 2-6 show a first of the two flip orientations with the first clamping frame 513 being below the second clamping frame 514. FIGS. 7-10 show a second of the two flip orientations with the second clamping frame 514 being below the first clamping frame 513. The photomask 6 may be square having a central symmetry axis AS. The photomask 6 may be stored in the transport container 7 in the initial arbitrary supply orientation and consequently held on the loader 91 and clamped in the photomask clamping unit 51 in an arbitrary initial spatial orientation as well. The arbitrary initial spatial orientation may include four different side orientations and two flip orientations. The photomask clamping unit 51 has preferably a single fixture configuration that can accommodate any arbitrary initial spatial orientation of the photomask 6.

Figure 11:
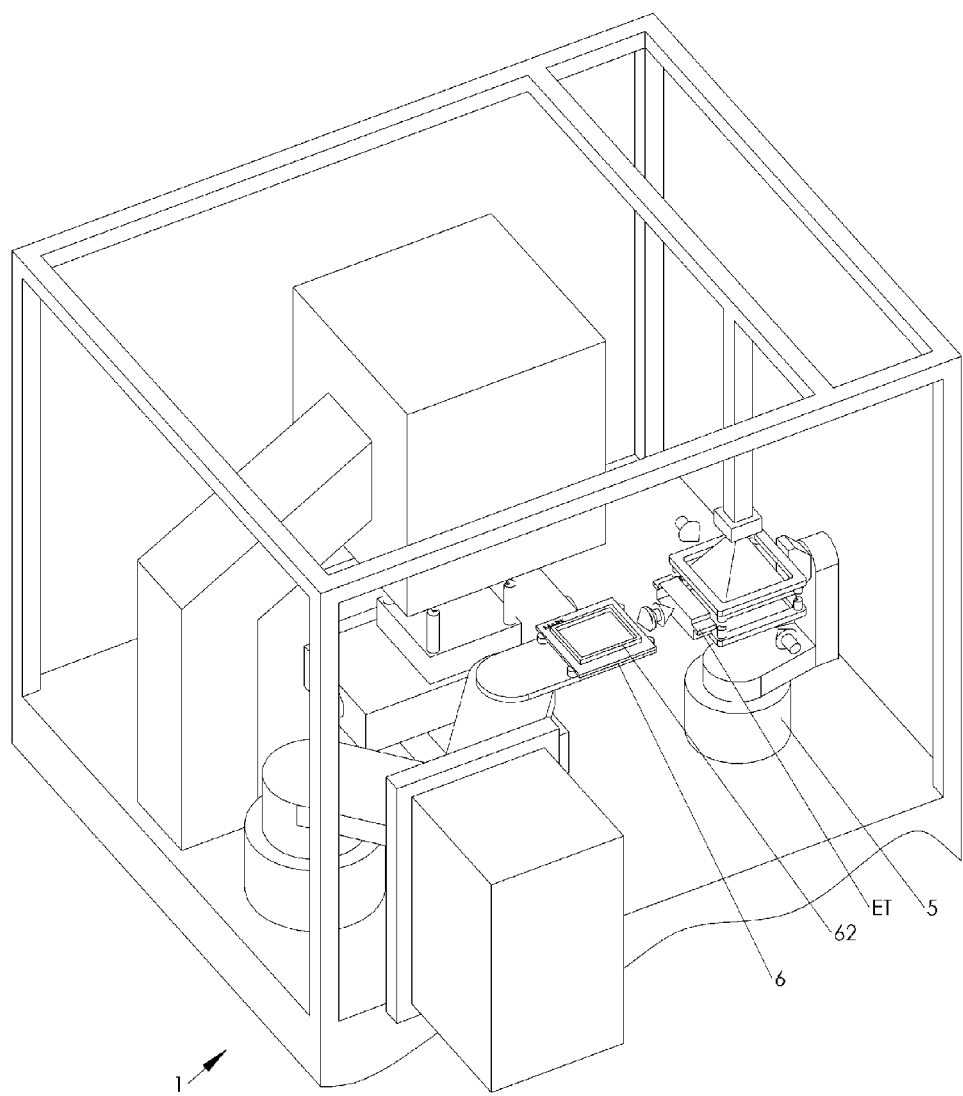
FIG. 11 is a schematic perspective view of a partial representative optical inspection device including a photomask with pellicle according to a third embodiment of the invention.
Figure 12:
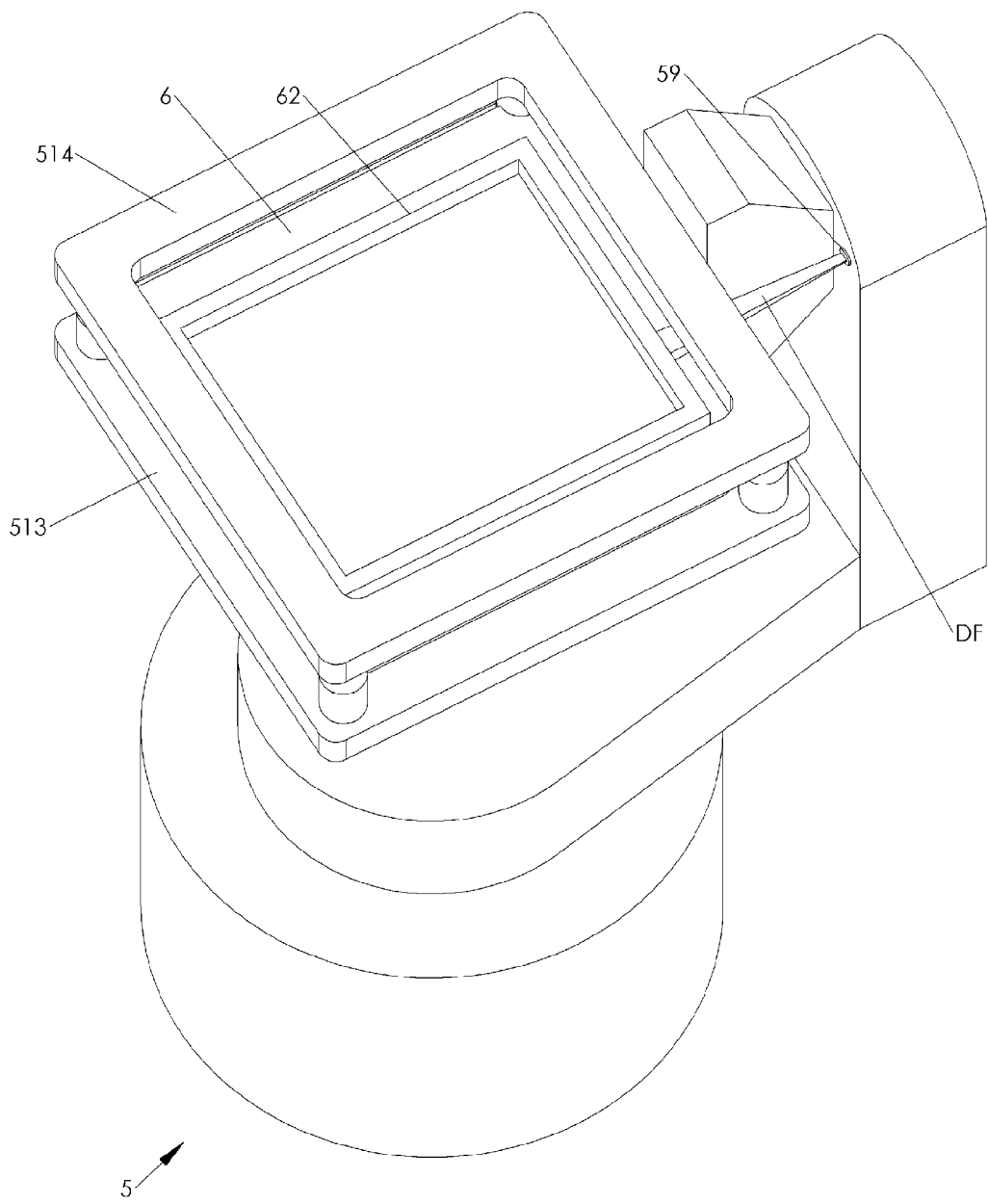
FIG. 12 is a schematic perspective view of a photomask flipper according to the third embodiment of the invention with clamped photomask having a pellicle.
Figure 13:
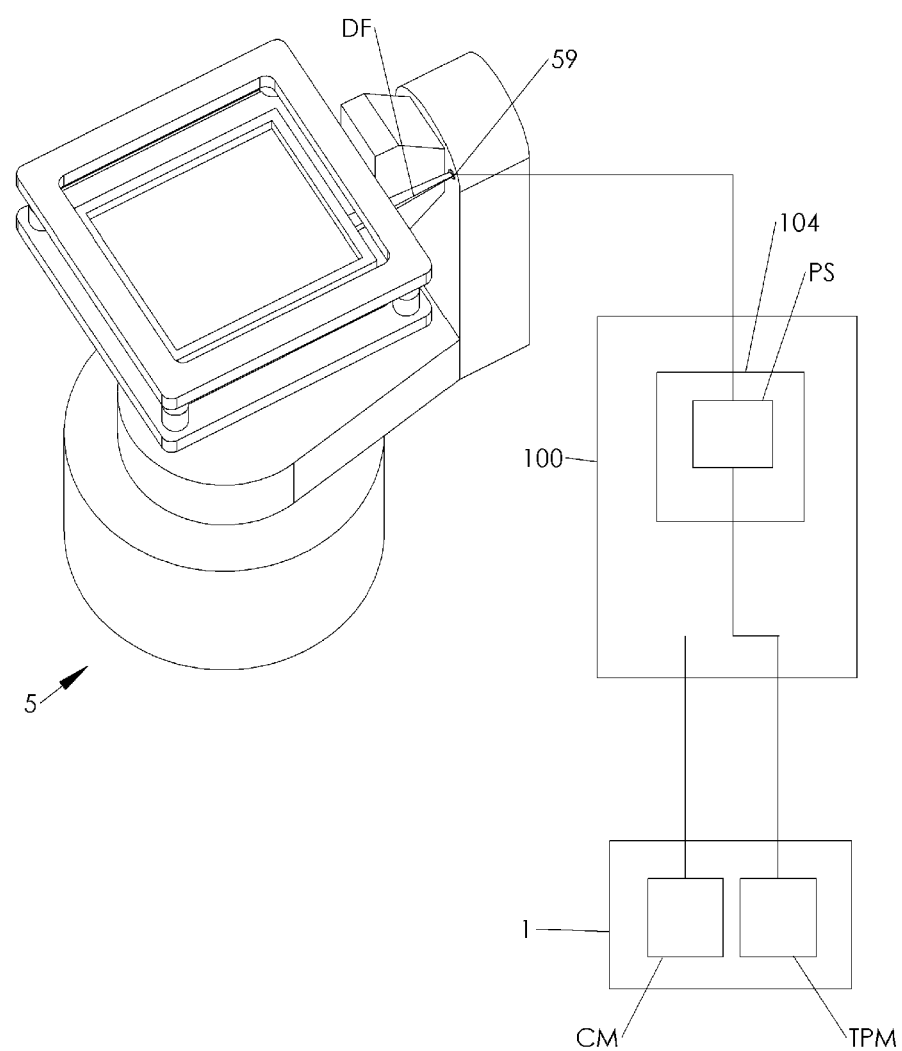
FIG. 13 is a schematic perspective view of the photomask flipper of FIG. 12 including a second computer control schematic.

As depicted in FIGS. 11-13, the photomask 6 may further feature on any one or both of its top and bottom sides a well known pellicle 62. In such a case and in accordance with an additional embodiment of the invention, the spatial flipper 5 may be particularly utilized for automatically detecting pellicles 62 as explained in more detail further below.

The external access port 8 may include also a well known elevator to vertically raise and lower the transport container 7 preferably in conjunction with a single plane operating robotic arm 9. Single plane operation means that the photomask 6 is transferred by the robotic arm 9 along the transfer plane LP without any vertical photomask 6 motion. Vertical motion for transferring the photomask 6 onto and from the robotic arm 9 may be provided by the cassette elevator and pin lifters 12. A spatial flipper 5 included in the optical inspection device 1 in accordance with the present invention may also be configured for raising the photomask 6 off the robotic arm 9 during photomask 6 clamping and lowering the photomask 6 during its unclamping. In that way, the robotic arm 9 may be configured in a highly compact fashion contributing to a desirably small overall footprint of the optical inspection device 1. The spatial flipper 5 has a transfer axes orientation TO with which it may be positioned in the optical inspection device 1 in alignment with a predetermined transfer axis AT of the robotic arm 9. Along the transfer axis TA, the photomask 6 is loaded into and unloaded from the spatial flipper 5. For the purpose of this invention, the transfer axis AT is considered symmetrical with respect to a top side and a bottom side of the photomask 6.

In accordance with the present invention, a digital camera 4 may also be included in the optical inspection device 1 and attached to the frame 2. The frame 2 may be any well known structural and immobile portion of the optical inspection device 1 contributing to the structural integrity and/or rigidity of the optical inspection device 1 as well as position rigidity of its components and any other included components such as the robotic arm 9, spatial flipper 5, digital camera 4 and external access port 8. The camera 4, which may also be connected to the flipper 5 instead of the frame 2, has a view field VF that extends through apertures 5131, 5141 of the two clamping frames 513, 514 while a clamped photomask 6 is oriented by the flipper 5 with its symmetry axis AS substantially parallel to the camera's 4 optical axis AO. Alternately, the flipper 5 may orient a clamped photomask 6 such that its symmetry axis AS is substantially perpendicular to the camera's 4 optical axis AO and such that the view field VF is in between the access gates GA1-GA4 of the flipper 5. This may be utilized for detecting the eventual presence of a pellicle 62 as explained further below.

The access gates GA1-GA4 symbolized in the Figures via arrow bodies GA1-GA4 are the gates that may be aligned by the spatial flipper 5 with the transfer access orientation TO, which in turn is aligned with transfer axis AT in assembly position of the spatial flipper 5. Across the transfer access orientation TO, the photomask 6 may be loaded into and/or unloaded from the flipper 5 within a spatial photomask transfer envelope ET. The spatial transfer envelope ET corresponds to the largest contours projected along the transfer axis AT of the photomask 6 together with an eventual pellicle 62 while resting on the photomask loader 91 and any portion of the photomask loader 91 predetermined to reach within one of the photomask access gates GA1-GA4 while the spatial flipper 5 is resting in its predetermined transfer access orientation TO and while the two clamping frames 513, 514 are open as depicted in FIGS. 1-6. While the two clamping frames 513, 514 close into clamping position, the photomask 6 is lifted off the photomask loader 91 and clamped between the clamping frames 513, 514. The clamping frames 513, 514 provide sufficient clearance in both flip orientations and in clamping position such that the photomask loader 91 may freely transfer in between the closed clamping frames 513, 514 in and out of the photomask clamping unit 51.

Figure 2:
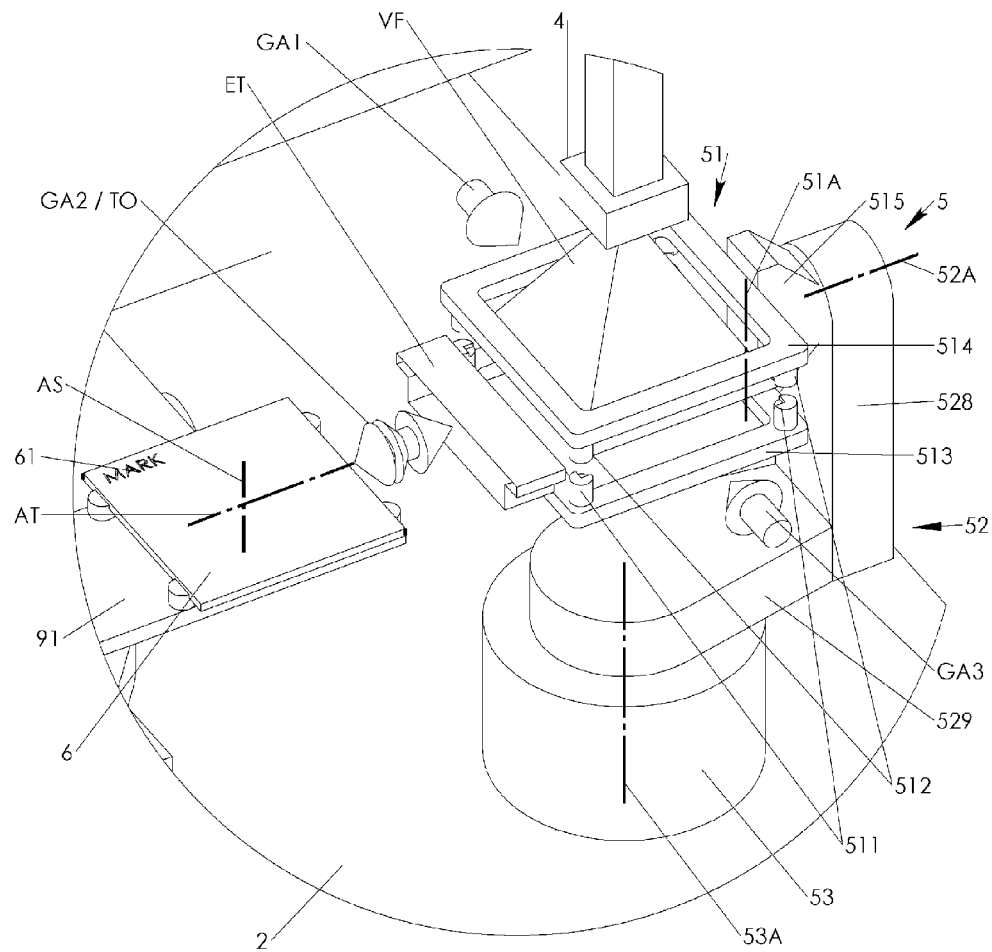
FIG. 2 is the View Detail A including the first embodiment of the invention.
Figure 3:
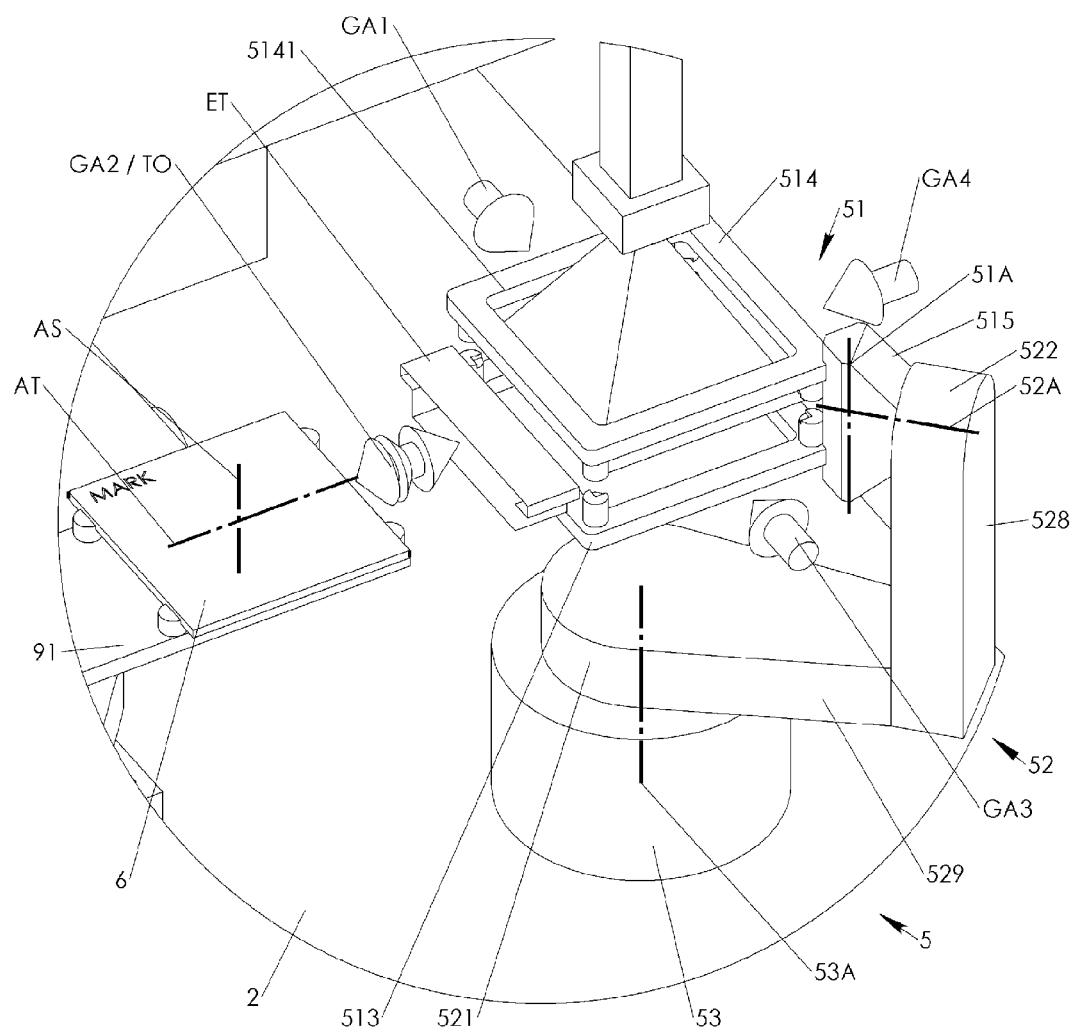
FIG. 3 is the View Detail A including a second embodiment of the invention.
Figure 4:
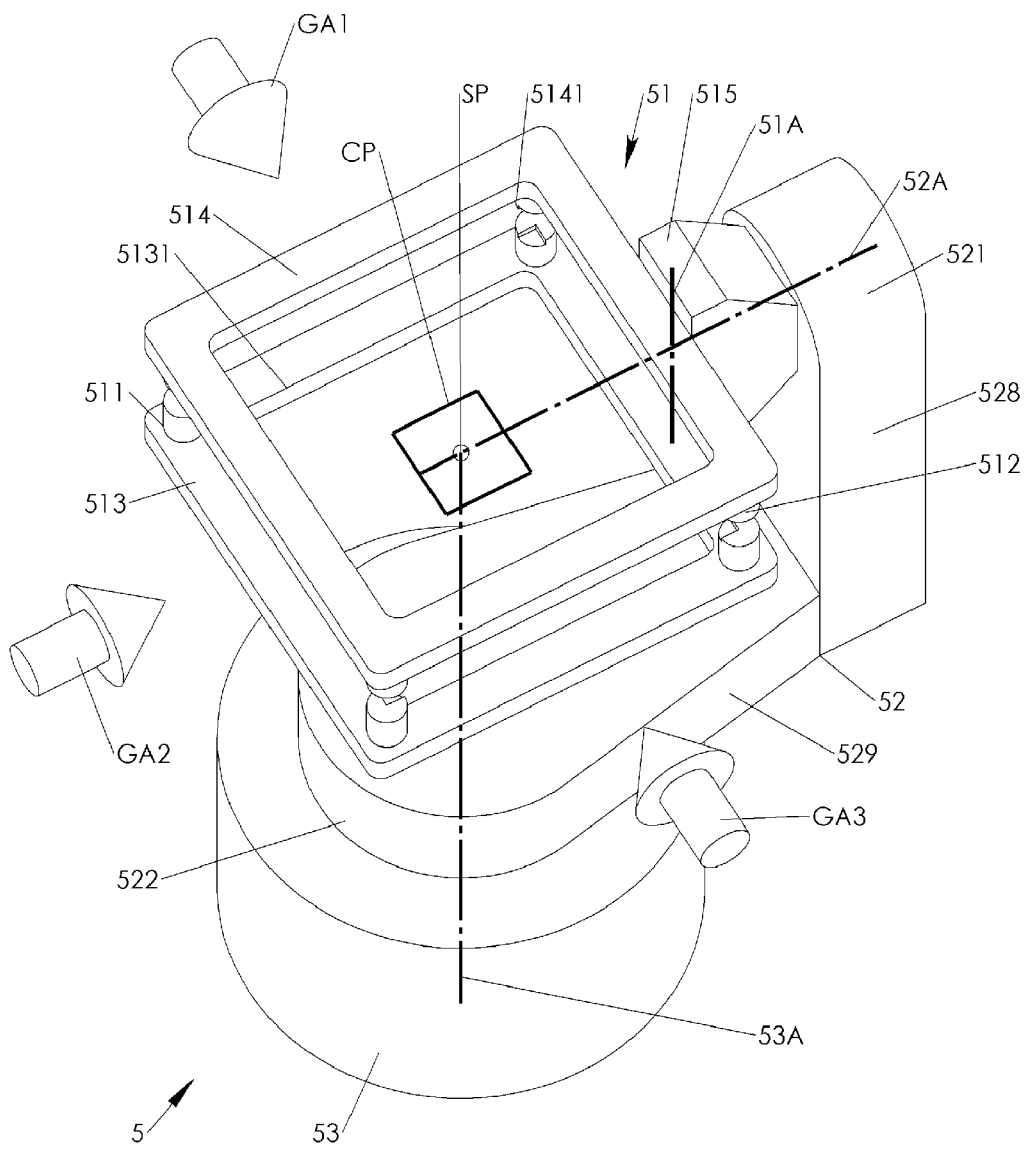
FIG. 4 is a schematic perspective view of a photomask flipper according to the first embodiment of the invention.

The photomask access gates GA1-GA4 are dimensioned to at least encompass the spatial photomask transfer envelope ET while in transfer access orientation TO. In FIGS. 1, 2, 3, the photomask clamping unit 51 is depicted with the photomask access gate GA2 being in the transfer access orientation TO. In FIGS. 7-10 the photomask clamping unit 51 is depicted with the photomask access gate GA1 being in the transfer access orientation TO.

Figure 9:
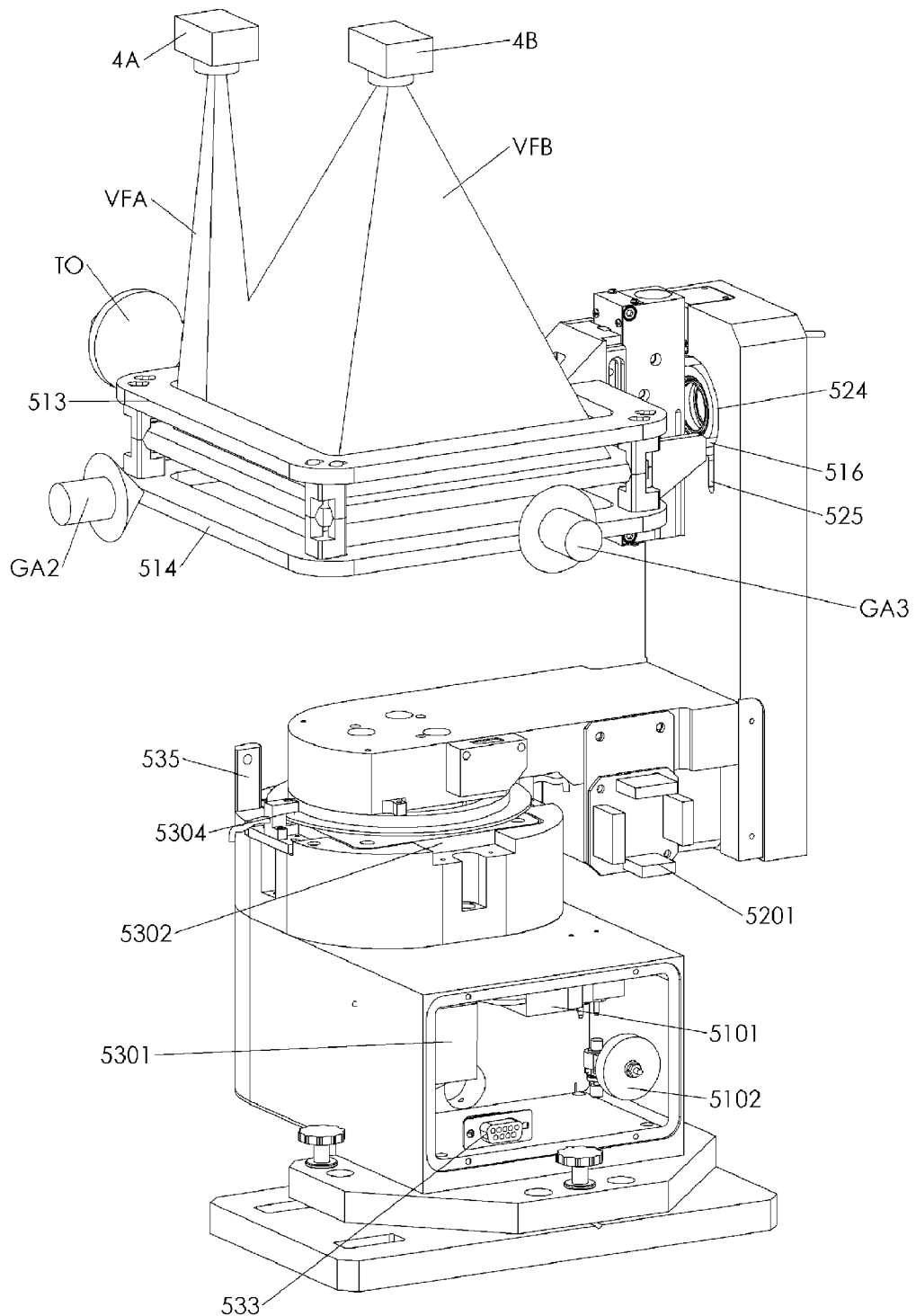
FIG. 9 is a third perspective view of the apparatus of FIG. 8.

The transfer access orientation TO may be structurally defined on the apparatus level by rotation limiters 535 as shown in FIG. 9, 10. The rotation limiters 535 in case of the depicted second embodiment spatial flipper 5 limit rotation of the link arm 52 to 180 degrees in conjunction with the maximum spanning angle MS of the photomask access gates GA1-GA3. The transfer access orientation TO may be chosen in one of three 90 degree steps within the 180 degree angle defined by rotation limiters 535. On the system level, the transfer access orientation TO may be structurally defined by positioning the robotic arm 9 and its transfer axis TA with respect to the assembled spatial flipper 5 and its eventual rotation limiters 535 and vice versa as may be well appreciated by anyone skilled in the art. Also on the system level, the transfer access orientation TO may be logically selected from one of the three 90 degree steps in conjunction with flipper 5 assembly orientation and transfer axis TA by a motion control algorithm 103 that is executed by a computer control 100 as may be well appreciated by anyone skilled in the art.

Referring to FIGS. 1, 2, 4, 7, 8, 9 and in accordance with a first embodiment of the invention, the spatial flipper 5 is configured for rotating the photomask 6 between at least two but preferably two flip orientations and up to one less all predetermined photomask 6 side orientations. There may be four side orientations according to the four sides of the photomask 6 and two flip orientations in accordance with top and bottom of the photomask 6. In accordance with the scope of the first embodiment of the invention, there are three photomask access gates GA1-GA3. There are a maximum of eight possible predetermined flipping orientations for the photomask 6 having a top and bottom side and four possible side orientations in which it may be arbitrarily initially oriented. Six of the eight flipping orientations may be accomplished in a single flipping cycle through the three photomask access gates GA1-GA3. In the other case in which the photomask 6 may need to be reoriented into the two remaining flipping orientations not provided by the three access gates GA1-GA3, a second loading cycle with intermediate photomask 6 reorientation may be performed as may be clear to anyone skilled in the art. The first embodiment may be preferably employed where a minimal footprint of the spatial flipper 5 is primarily desired.

Figure 5:
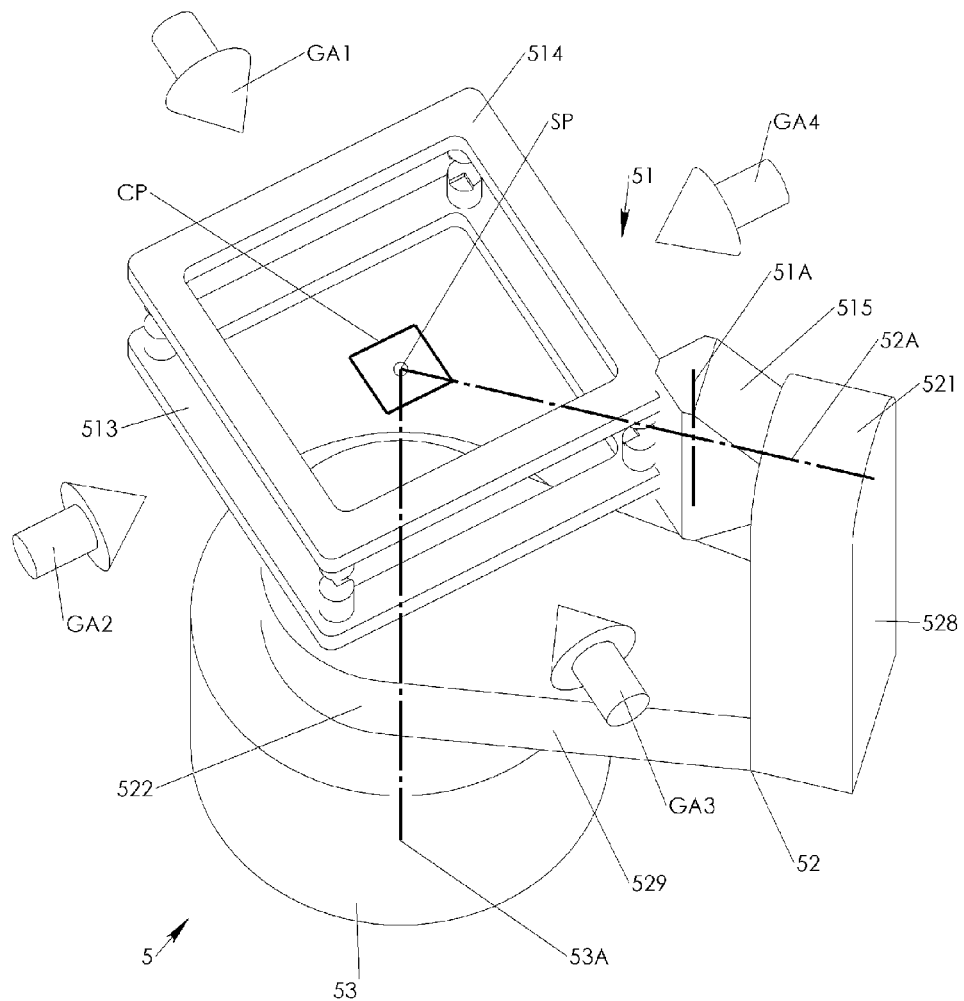
FIG. 5 is a schematic perspective view of a photomask flipper according to the second embodiment of the invention.
Figure 6:
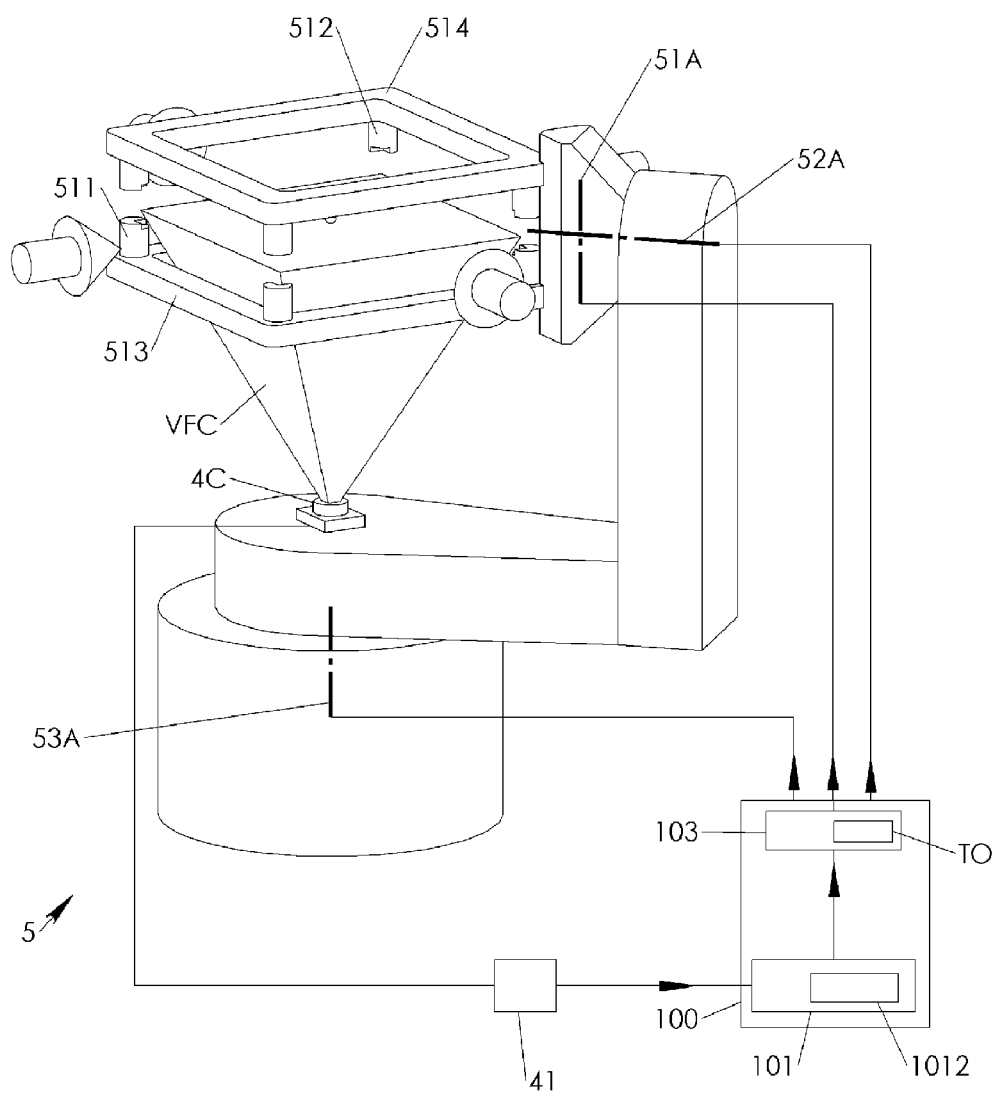
FIG. 6 is a schematic perspective view of the photomask flipper of FIG. 5 including a first computer control schematic.

Referring to FIGS. 3, 5, 6 and in accordance with a second embodiment of the invention, the spatial flipper 5 is configured for rotating the photomask 6 between at least two flip orientations and up to all predetermined photomask side orientations. Four photomask access gates GA1-GA4 may be present. The maximum spanning angle MS may be 270 degrees providing four 90 degree steps from which the transfer access orientation TO is selected as described above for the first embodiment. Hence, the loaded photomask 6 may be reoriented in any of the eight predetermined orientation in a single flipping cycle irrespective any arbitrary initial loading orientation of the photomask 6.

Referring back to the first and second embodiments, the spatial flipper 5 may include a photomask clamping unit 51, a base 53 and a link arm 52 having a first functional end 521 and a second functional end 522 that is opposite the first functional end 521. First and second functional ends 521, 522 in context with the present invention are ends in substantially structural rigid connection with access for electrical, signal and eventual vacuum access across each of them and in between them. The photomask clamping unit 51 is rotationally held via the first motored rotation axis 52A at the first link arm end 521. The link arm 52 in turn is rotationally held via the second motored rotation axis 53A at the base 53. The first motored rotation axis 52A is preferably horizontal and the second motored rotation axis 53A is preferably vertical with respect to its actual and/or intended assembly orientation in the optical inspection device 1 as shown in FIG. 1 and/or as defined by an attachment flange 532 as representatively shown in FIGS. 7-10. The second motored rotation axis 53A is in a substantial angle and a spacing with respect to the first motored rotation axis 52A such that preferably each of the photomask access gates GA1-GA3 in the first embodiment or GA1-GA4 in the second embodiment is alternately oriented at least into both flip orientation by a combined motored rotation of the photomask clamping unit 51 around the first motored rotation axis 52A and the link arm 52 around the second motored rotation axis 53A.

The photomask clamping unit 51 features a double acting photomask clamper 515 moving two attached clamping frames 513, 514 in two respective and opposing clamp motions along a motored clamping axis 51A substantially symmetric with respect to the first motored rotation axis 52A such that the two clamping frames 513, 514 synchronously move towards or away from each other substantially equidistant with respect to the first motored rotation axis 52A. The motored clamping axis 51A is at least close to perpendicular to the main clamping plane CP of the photomask clamping unit 51 and preferably substantially vertically rotated while the photomask clamping unit 51 is in transfer access orientation TO. The clamping plane CP preferably coincides with the first motored rotation axis 52A and is preferably symmetric with respect to top and bottom side of the clamped photomask 6.

The first motored rotation axis 52A is substantially above the photomask transfer axis AT such that a loaded photomask 6 is raised during clamping motion of the two clamping frames 513, 514 to the extend such that any element of the robotic arm loader 91 may be retracted again unimpeded by the clamped photomask 6. Vice versa and during unloading of the flipped photomask 6, reversed clamping motion of the two clamping frames 513, 514 away from each other results into a transfer of the photomask 6 back onto the robotic arm loader 91. The opposing clamp motions are preferably symmetric with respect to the first motored rotation axis 52A to the effect that photomask 6 transfer from and back onto the robotic arm 9 loader 91 is substantially equally performed irrespective which one of the two clamping frames 513, 514 is on top of the other. The photomask 6 is consequently equally transferred in both flip orientations.

Figure 7:
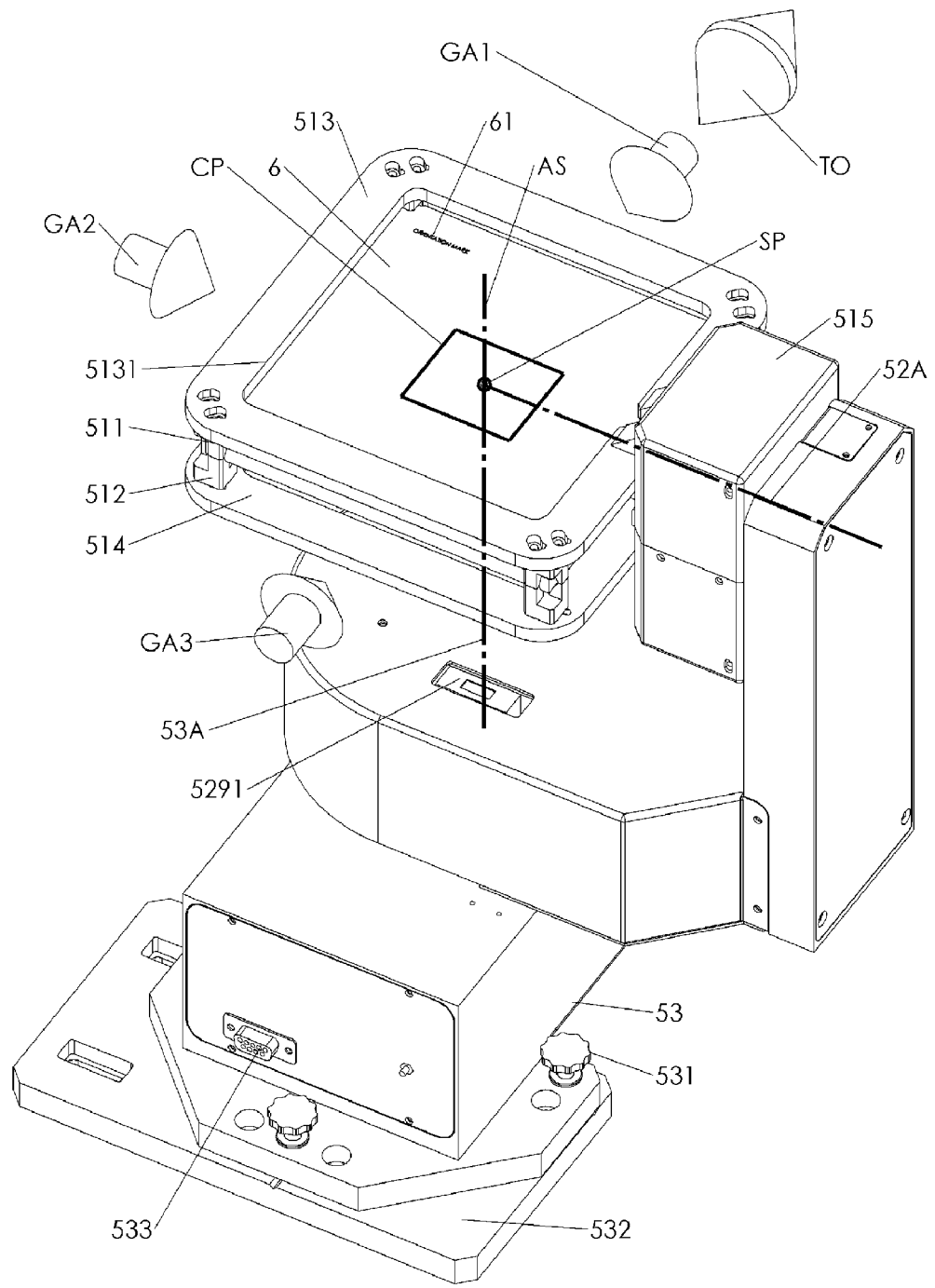
FIG. 7 is a first perspective view of a representative apparatus according to the first embodiment of the invention.
Figure 8:
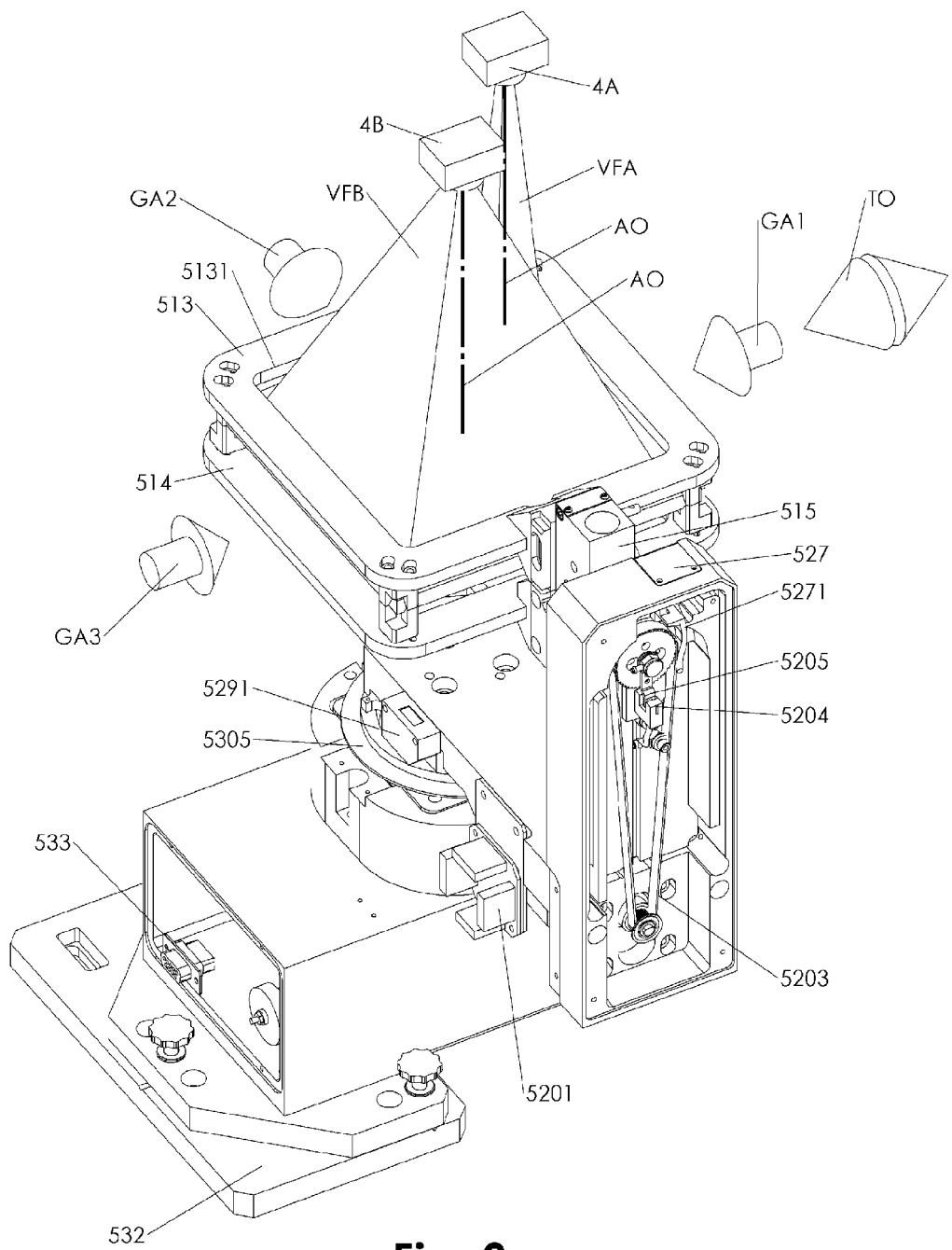
FIG. 8 is a second perspective view of the apparatus of FIG. 7 without housings and covers.

The multiple clamping points 511, 512 are held in two clamping frames 513, 514. The multiple clamping points 511, 512 are eight oppositely paired corner clamping wedges 511, 512 that wedge clamp the photomask 6 in the immediate vicinity of its eight corners while the photomask clamping unit 51 is closed. Each access gate GA1-GA4 extends in between two adjacent pairs of the oppositely paired clamping points 511, 512 and in between the two clamping frames 513, 514. Each access gate GA1-GA4 encompasses a spatial transfer envelope ET at least while the two clamping frames 513, 514 are closed as shown in FIGS. 7-9 and while in access transfer orientation TO in either one of the preferably two flip orientations.

Further part of the photomask clamping unit 51 may be one or two cam sliders 516, 517 connected to a respective one of the two clamping frames 514, 513. Correspondingly, the link arm 52 features a clamper control cam 524-525 that is circumferentially positioned with respect to the first motored rotation axis 52A and continuously snugly accessible to the cam slider(s) 516, 517. Parts of the clamper control cam 524-525, are lock release cams 525 and a circumferential lock cam 524. The lock release cams 525 are oriented around the first motored rotation axis 52A such that the cam sliders 516, 517 and the connected clamp frames 514, 513 are lock released at each of the two flip orientations. The circumferential lock cam 524 is connected to the lock release cams 525 and positioned radially equidistant with respect to the first motored rotation axis 52A such that the cam sliders 516, 517 and the connected respective clamping frames 514, 513 are clamp fixed while the photomask 6 is motored rotated around the first motored rotation axis 52A between the two flip orientations. In that way, the clamper control cam 524-525 together with the cam slider(s) 516, 517 structurally locks the clamping frames 514, 513 against inadvertent opening during rotation and inadvertent dropping of the photomask 6. In either of the two flip orientations in which the photomask 6 securely rests by its own weight on one of the two clamp frames 513, 514 the lock release cams 525 give room for the cam sliders 516, 517 to move freely while the clamping frames 513, 514 open and/or close. In the case where the two opposing clamp motions are mechanically linked for example inside the clamping actuator 515, only a single cam slider 516 or 517 may be employed.

As depicted in the Figures, the link arm 52 is preferably L-shaped and features a first arm member 528 and a second arm member 529 in an elbow connection with each other. The first arm member 528 extends substantially in radial direction away from the first motored rotation axis 52A and the second arm member 529 extends substantially in radial direction away from the second motored rotation axis 53A. The L-shaped link arm 52 provides preferably for a coinciding of the first and second motored rotation axes 52A and 53A in a clamping center point SP of the photomask clamping unit 51. The clamping center point SP in turn preferably coincides with the clamping plane CP and photomask symmetry axis AS while the photomask 6 is clamped in between the closed clamping frames 513, 514 as shown in FIG. 7. In this case and as a preferred result, the photomask 6 may be reoriented in any of the six or eight predetermined orientations and transferred back onto the loader 91 without need to adjust transfer axis AT and photomask receiving position of the loader 91 beneath the clamped photomask 6. Nevertheless, the present invention may include also embodiments in which the clamping center point SP coincides with none or only with one of the two motored rotation axes 52A, 53A. In these cases, the transfer axis AT, loading plane LP and/or the photomask receiving position of the loader 91 may need to be adjusted for individual ones of the six or eight predetermined final photomask orientations as may be well appreciated by anyone skilled in the art.

To provide automated recognition of an eventual arbitrary initial spatial orientation of the photomask 6, a view field VF of the camera 4 is positioned and configured such that it coincides at least with a portion of the photomask 6 while the photomask 6 is clamped in the photomask clamping unit 51 in one of the two flipping orientations. A circumferential mark 61 commonly placed on the photomask 6 for identification purposes may be employed as an orientation mark 61 for automatically determining the eventual arbitrary initial photomask 6 orientation. For that purpose, the camera 4 position and view field VF configuration may be such that the view field VF encompasses the orientation mark 61 while the photomask 6 is corner clamped in the photomask clamping unit 51 and while the photomask 6 is rotated into at least one of all eight predetermined photomask side orientations.

Figure 10:
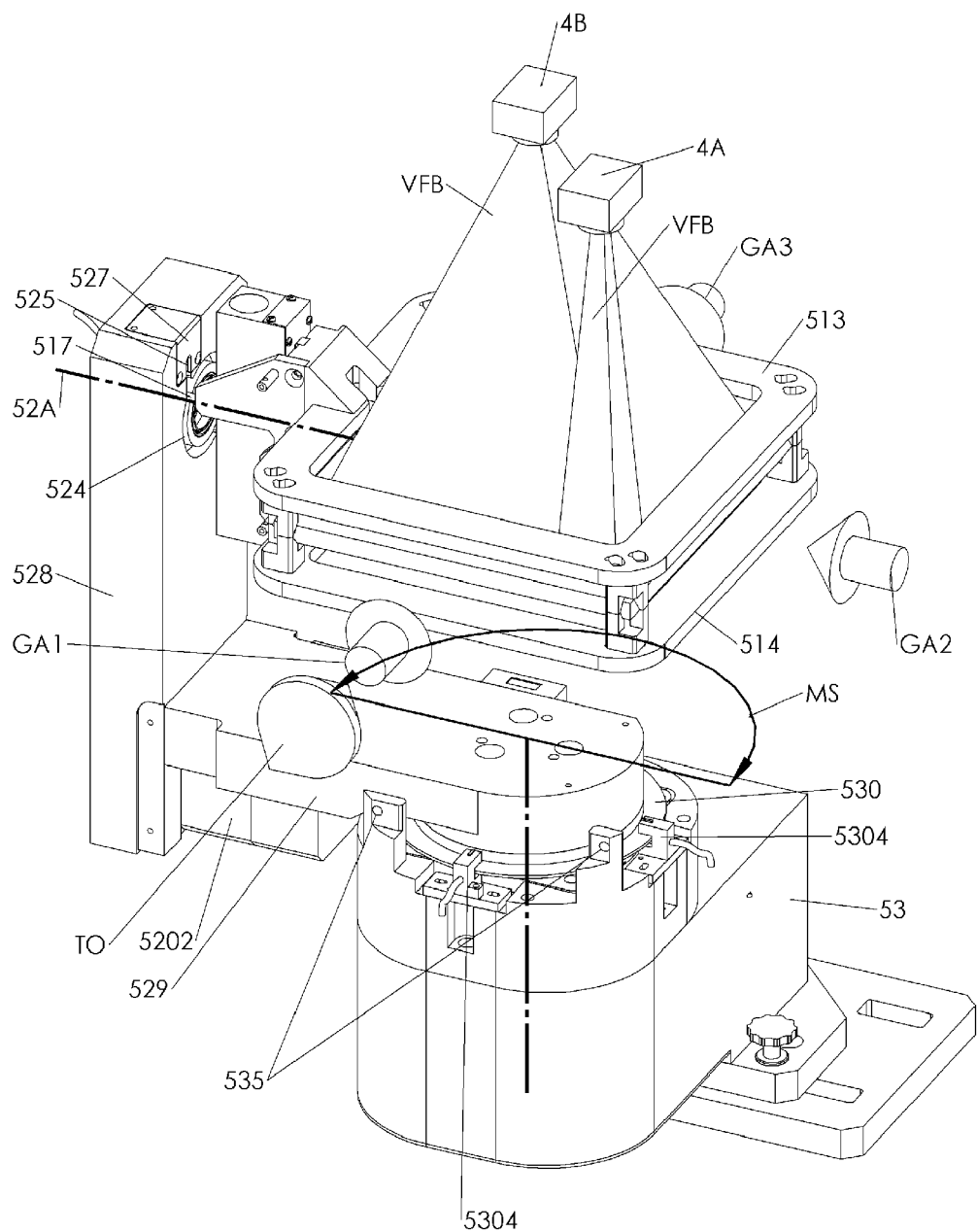
FIG. 10 is a fourth perspective view of the apparatus of FIG. 8.

FIGS. 8-10 depict camera 4A having a view field VFA that encompasses the orientation mark 61 in only one of the four side orientations. In this case, the digital image 41 created with the camera 4 may contain a minimal digital information for fast image processing and eventual identification of the orientation mark 61. Fast image processing may be on the expense of eventually up to eight times reorientation of the photomask 6 and eight images to be taken and processed for identifying any of the eight possible arbitrary initial spatial orientations of the photomask 6 as may be well appreciated by anyone skilled in the art.

FIGS. 6, 8-10 depict camera 4B, 4C having a view field VFB, VFC that encompasses the orientation mark 61 in any one of the four side orientations. In this case, the digital image 41 created with camera 4 may contain a maximum digital information for a single image processing per flip orientation and eventual identification of the orientation mark 61. Extensive image processing provides the benefit of only up to two times reorientation of the photomask 6 and two images to be taken and processed for identifying any of the eight possible arbitrary initial spatial orientations of the photomask 6 as may be well appreciated by anyone skilled in the art. A combination of top camera 4B and bottom camera 4C may even provide for computational identification of any arbitrary initial spatial photomask 6 orientation from two images 41 simultaneously taken from the top and bottom side of the photomask 6.

Also and in case of the orientation mark 61 being placed on a translucent portion of the photomask, the image 41 may capture the orientation mark 61 through the photomask 6. The orientation mark 61 may include letters and numbers and the image processing algorithm 101 of the computer control 100 may include a character recognition algorithm 1012 to determine whether or not the orientation mark 61 is facing the camera 4. In that fashion, a single camera 4B or 4C may suffice to provide identification of any of the eight initial arbitrary spatial photomask 6 orientations from a single image 41 taken preferably immediately following the clamping of the photomask 6.

The spatial flipper 5 as representatively depicted in FIGS. 7-10 may include a number of well known structural and control features well known for computer controlled and automatically operating devices. Such well known features include a photomask 6 detection sensor 5291, an electric signal and power connector 533. The clamp actuator 515 may be vacuum actuated and controlled via a signal controlled solenoid valve 5101 and a vacuum regulator 5102. The first motored rotation axis 52A may be driven and controlled by a timing belt drive 5203, a first stepper motor 5202, a first stepper motor control card 5201 and a first rotation position sensor 5204 interacting with rotation marker 5205. The second motored rotation axis 53A may be driven and controlled by a second stepper motor 5302 embedded in the base 53, a second stepper motor control card 5301, second rotation position sensors 5304 interacting with dial 5305. Behind the cover 527 a cam slider position sensor 5271 may control opening and closing of the upper one of the two clamping frames 513 or 514 and the mechanically linked lower one of the two clamping frames 513, 514. Mechanical linkage may be provided in a well known fashion inside the clamp actuator 515, which may be a commercially available component.

According to FIGS. 11-13 and a third embodiment of the invention, the spatial photomask flipper 5 may be configured for automatically detecting an eventual well known pellicle 62 on the photomask 6. The photomask clamping unit 51 may be configured to accommodate for a spatial photomask transfer envelope ET that corresponds also to the pellicle 62.

A pellicle detection sensor 59 may be positioned with respect to a predetermined pellicle detection orientation of the photomask clamping unit 51 such that at least a portion of the pellicle 62 is within a detection field DF of the pellicle detection sensor 59 while the respective photomask 6 is clamped in the photomask clamping unit 51 and while the photomask clamping unit 51 is in pellicle detection orientation. In case of a pellicle 62 component being detected, a pellicle recognition signal PS may be generated by the pellicle detection sensor 59. The pellicle detection signal PS in turn may initiate a through-pellicle measurement procedure TPM instead of a conventional photomask measurement procedure CM of the optical inspection device 1. The through-pellicle measurement procedure TPM may account for the optical distortion of the protective pellicle layer.

As is well known in the art, the pellicle 62 commonly includes a pellicle frame surrounding the central portion of the photomask 6 that need to be protected. The pellicle frame provides spacing for a protective top layer above the photomask 6. Since the pellicle frame is a solid and commonly opaque structure rising above the photomask 6 it may be preferably targeted by the pellicle detection sensor 59.

Referring to FIG. 12, the pellicle detection orientation may be the same as the two flip orientations providing for an pellicle detection immediately after transfer of the photomask 6 from the loader 91 onto the photomask clamping unit 51 or immediately prior to a transfer of the photomask back onto the loader 91.

The digital camera 4, 4A, 4B or 4C may be alternately employed as pellicle detection sensor. The camera's 4, 4A, 4B or 4C view field VF, VFA, VFB, VFC becomes thereby also the pellicle detection field DF. While the photomask clamping unit is the pellicle detection orientation, a digital image taken by the cameras 4, 4A, 4B or 4C may be processed by a pellicle recognition algorithm 104 to automatically detect in the digital image predetermined components such as the pellicle frame of the pellicle 62 as may be appreciated by anyone skilled in the art. Hence, the pellicle recognition signal PS may be processed within the computer control 100 from the digital image.

Once a transport container 7 is connected to the external access port 8 and the optical inspection device 1 is operational, a photomask 6 may be lowered onto the loader 91 while inserted through the access port 8 into the transport container. To receive the photomask 6, the photomask clamping unit 51 is oriented via first and second motored rotation axes 52A, 53A with one of the photomask access gates GA1-GA4 into the transfer access orientation TO. The cam sliders 516 are moved within the respective lock release cams 525 and the cam slider position sensor 5271 detects and confirms that the clamping frames 513, 514 are open. Once the photomask 6 is transferred onto the loader 91, the photomask 6 is moved along the transfer axis AT, along the loading plane LP and within the spatial photomask transfer envelope ET in between the two open clamping frames 513, 514. The lock release cams 525 ensure in conjunction with the cam sliders 516 that the photomask clamping unit 51 may only rotate once the clamping frames 513, 514 are closed and the photomask 6 is securely lifted off the loader 91 and point clamped.

Once the photomask 6 is transferred from the loader 91 and clamped in between the clamping frames 513, 514, an image 41 may be taken by the camera 4. The image 41 may be processed by the image recognition algorithm 101 and eventually by the pellicle recognition algorithm within the computer control 100 and the initial arbitrary spatial orientation of the photomask 6 inside the photomask clamping unit 51 is then computationally detected. Depending on camera 4, 4A, 4B, 4C position and view field VF configuration as explained above, the photomask clamping unit 51 may be repeatedly rotated such that other photomask access gates GA1-GA4 are aligned with the transfer access orientation TO and more images 41 are taken until an image 41 containing the orientation mark 61 is finally processed and the initial arbitrary spatial orientation of the photomask 6 computationally detected.

The pellicle 62 may be detected on either side of the photomask 6 by providing two pellicle detection orientations or taking digital images from both sides of the photomask 6 at a single pellicle detection orientation as may be the case of two digital cameras 4A and 4C being concurrently employed. In case of a separate pellicle detection sensor 59 being employed instead of the pellicle recognition algorithm, the computer control 100 recognizes an eventual pellicle recognition signal PS directly instead of computationally processing the pellicle recognition signal from the taken digital image. In case of a pellicle recognition signal PS indicating the presence of a pellicle 62, the optical inspection device 1 may prepare for the though-pellicle measurement procedure TPM.

Once the computer control 100 has knowledge of one of the eight possible initial arbitrary spatial orientations of the photomask 6 in the photomask clamping unit 51, one or both motored rotation axes 52A, 53A are actuated by the motion control algorithm 103 such that the photomask 6 is spatially flipped in its predetermined final orientation. In case of the first embodiment and as explained above, the photomask 6 may be unloaded onto the loader 91 and reloaded in a different photomask access gate GA1-GA3 before the photomask 6 may be flipped again into the predetermined final orientation. Once the photomask 6 is in its predetermined final orientation, it may be transferred back onto the loader 91 and moved by the robotic arm 9 either onto the inspection site 11 or back into the transport container 7 and an eventually following one photomask 6 may be automatically spatially reoriented.

Accordingly, the scope of the present invention described in the Figures and the Specification above is set forth by the following claims and their legal equivalent:

What is claimed is:

1. A spatial photomask flipper comprising:
   a. a photomask clamping unit comprising:
      i. a double acting photomask clamper providing two opposing clamp motions along a motored clamping axis;
      ii. two clamping frames attached to said double acting photomask clamper for exercising said opposing clamp motions;
      iii. multiple clamping points oppositely paired and oppositely attached to respective ones of said two clamping frames for point clamping said photomask;
      iv. multiple photomask access gates in a number of up to one less all predetermined photomask side orientations for accessing along a photomask transfer axis and within a spatial photomask transfer envelope up to said one less all predetermined photomask side orientations while said photomask being said point clamped and while said photomask clamping unit being spatially rotated into a transfer access orientation, wherein each of said multiple access gates extends in between two adjacent pairs of said oppositely paired clamping points and in between said two clamping frames;
   b. a link arm comprising a first motored rotation axis rotationally holding said photomask clamping unit at a first functional end of said link arm, said first functional end being opposite a second functional end of said link arm;
   c. a base comprising a second motored rotation axis rotationally holding said link arm at said second functional end; and
   wherein:
   a. said transfer access orientation is an orientation of said photomask clamping unit in which an alternating one of said multiple photomask access gates is facing said transfer axis in either of at least two flip orientations and encompassing said spatial photomask transfer envelope at least while said two clamping frames are open;
   b. said second motored rotation axis is in a substantial angle and a spacing with respect to said first motored rotation axis such that said alternating one photomask access gate is alternately oriented into said at least two flip orientations while in said transfer access orientation by a combined motored rotation of said photomask clamping unit around said first motored rotation axis and said link arm around said second motored rotation axis;
   c. said spatial photomask transfer envelope corresponds to the largest projected contours of said photomask while resting on a photomask loader and corresponds to any portion of said photomask loader predetermined to reach within said alternating one photomask access gate; and
   d. said photomask transfer axis being symmetric with respect to a top side and bottom side of said photomask while resting on a robotic loading arm, said two opposing clamping motions being substantially symmetric with respect to said first motored rotation axis, and said first motored rotation axis being substantially above said transfer axis such that said photomask is substantially equally raised and lowered with respect to said photomask transfer axis by a lower one of said two clamping frames during either of said at least two flip orientations.

2. The spatial photomask flipper of claim 1, wherein said photomask clamping unit further comprises a cam slider connected to a respective one of said two clamping members and wherein said link arm further comprises a clamper control cam circumferentially positioned on said link arm with respect to said first motored rotation axis and continuously snugly accessible to said cam slider, said clamper control cam comprising:
   a. a lock release cam oriented around said first motored rotation axis and said first motored rotation axis such that said cam slider and a connected one of said two clamping frames are lock released at each of said two flip orientations; and
   b. a circumferential lock cam connected with said lock release cam and radially equidistant positioned with respect to said first motored rotation axis such that said cam slider and said connected one clamping frame are clamp fixed while said photomask clamping unit is motored rotated around the first motored rotation axis and between said two flip orientations.

3. The spatial photomask flipper of claim 1, further comprising:
   a. said multiple photomask access gates in a number of three; and
   b. said multiple clamping points configured as eight oppositely paired corner clamping wedges.

4. The spatial photomask flipper of claim 1, wherein said two opposing clamp motions are mechanically linked and wherein said cam slider consists of a single cam slider connected to a single of said two clamping members.

5. The spatial photomask flipper of claim 1, wherein said link arm is L-shaped and comprises a first arm member in a elbow connection with a second arm member, said first arm member extending substantially in radial direction away from said first motored rotation axis and said second arm member extending substantially in radial direction away from said second motored axis.

6. The spatial photomask flipper of claim 5, wherein said first arm member and said second arm member are configured such that a clamping center point of said photomask clamping unit substantially coincides with said first motored rotation axis and said second motored rotation axis.

7. The spatial photomask flipper of claim 1, wherein said base further comprises a digital camera having a view field coinciding at least with a portion of said photomask while said photomask is clamped in said photomask clamping unit and while said photomask clamping unit is in one of said two flipping orientations.

8. The spatial photomask flipper of claim 7, wherein:
   a. said photomask comprises an orientation mark; and
   b. said view field encompasses said orientation mark while said photomask is corner clamped as said and while said photomask is rotated into at least one of said all predetermined photomask side orientations.

9. The spatial photomask flipper of claim 8, wherein said view field encompasses said orientation mark while said photomask is corner clamped as said and while said photomask is rotated into any one of said all predetermined photomask side orientations.

10. The spatial photomask flipper of claim 1 being part of an optical inspection device.

11. The spatial photomask flipper of claim 1, wherein said motored clamping axis is vertical such that said photomask is lowered while said double acting photomask clamper opens and such that said photomask is raised while said double acting photomask clamper closes.

12. A spatial photomask flipper comprising:
   a. a photomask clamping unit comprising:
      iv. a double acting photomask clamper providing two opposing clamp motions along a motored clamping axis;
      v. two clamping frames attached to said double acting photomask clamper for exercising said opposing clamp motions;
      vi. multiple clamping points oppositely paired and oppositely attached to respective ones of said two clamping frames for point clamping said photomask;
      iv. multiple photomask access gates in a number of up to all predetermined photomask side orientations for accessing along a photomask transfer axis and within a spatial photomask transfer envelope up to said all predetermined photomask side orientations while said photomask being said point clamped and while said photomask clamping unit being spatially rotated into a transfer access orientation, wherein each of said multiple access gates extends in between two adjacent pairs of said oppositely paired clamping points and in between said two clamping frames;
   b. a link arm comprising a first motored rotation axis rotationally holding said photomask clamping unit at a first functional end of said link arm, said first functional end being opposite a second functional end of said link arm;
   c. a base comprising a second motored rotation axis rotationally holding said link arm at said second functional end; and
   wherein:
   a. said transfer access orientation is an orientation of said photomask clamping unit in which an alternating one of said multiple photomask access gates is facing said transfer axis in either of at least two flip orientations and encompassing said spatial photomask transfer envelope at least while said two clamping frames are open;
   b. said second motored rotation axis is in a substantial angle and a spacing with respect to said first motored rotation axis such that said alternating one photomask access gate is alternately oriented into said at least two flip orientations while in said transfer access orientation by a combined motored rotation of said photomask clamping unit around said first motored rotation axis and said link arm around said second motored rotation axis;

c. said spatial photomask transfer envelope corresponds to the largest projected contours of said photomask while resting on a photomask loader and corresponds to any portion of said photomask loader predetermined to reach within said alternating one photomask access gate;

d. said photomask transfer axis being symmetric with respect to a top side and bottom side of said photomask while resting on a robotic loading arm, said two opposing clamping motions being substantially symmetric with respect to said first motored rotation axis, and said first motored rotation axis being substantially above said transfer axis such that said photomask is substantially equally raised and lowered with respect to said photomask transfer axis by a lower one of said two clamping frames during either of said at least two flip orientations; and e. wherein said photomask clamping unit is oriented with two adjacent of said multiple photomask access gates oppositely adjacent said first motored rotation axis and said link arm is configured for non interfering with said photomask transfer envelope while said two adjacent photomask access gates are alternately aligned as said with said spatial photomask handling channel such that said photomask is accessed in said up to all predetermined photomask side orientations while clamped in said photomask clamping unit.

13. The spatial photomask flipper of claim 12, wherein said photomask clamping unit further comprises a cam slider connected to a respective one of said two clamping members and wherein said link arm further comprises a clamper control cam circumferentially positioned on said link arm with respect to said first motored rotation axis and continuously snugly accessible to said cam slider, said clamper control cam comprising:

a. a lock release cam oriented around said first motored rotation axis and said first motored rotation axis such that said cam slider and a connected one of said two clamping frames are lock released at each of said two flip orientations; and b. a circumferential lock cam connected with said lock release cam and radially equidistant positioned with respect to said first motored rotation axis such that said cam slider and said connected one clamping frame are clamp fixed while said photomask clamping unit is motored rotated around the first motored rotation axis and between said two flip orientations.

14. The spatial photomask flipper of claim 12, further comprising;

a. said multiple photomask access gates in a number of three; and b. said multiple clamping points configured as eight oppositely paired corner clamping wedges.

15. The spatial photomask flipper of claim 12, wherein said two opposing clamp motions are mechanically linked and wherein said cam slider consists of a single cam slider connected to a single of said two clamping members.

16. The spatial photomask flipper of claim 12, wherein said link arm is L-shaped and comprises a first arm member in a elbow connection with a second arm member, said first arm member extending substantially in radial direction away from said first motored rotation axis and said second arm member extending substantially in radial direction away from said second motored axis.

17. The spatial photomask flipper of claim 16, wherein said first arm member and said second arm member are configured such that a clamping center point of said photomask clamping unit substantially coincides with said first motored rotation axis and said second motored rotation axis.

18. The spatial photomask flipper of claim 12, wherein said base further comprises a digital camera having a view field coinciding at least with a portion of said photomask while said photomask is clamped in said photomask clamping unit and while said photomask clamping unit is in one of said two flipping orientations.

19. The spatial photomask flipper of claim 18, wherein:

a. said photomask comprises an orientation mark; and b. said view field encompasses said orientation mark while said photomask is corner clamped as said and while said photomask is rotated into at least one of said all predetermined photomask side orientations.

20. The spatial photomask flipper of claim 19, wherein said view field encompasses said orientation mark while said photomask is corner clamped as said and while said photomask is rotated into any one of said all predetermined photomask side orientations.

21. The spatial photomask flipper of claim 12 being part of an optical inspection device.

22. The spatial photomask flipper of claim 12, wherein said motored clamping axis is vertical such that said photomask is lowered while said double acting photomask clamper opens and such that said photomask is raised while said double acting photomask clamper closes.

23. A system for automatically spatially rotating an orientation marked photomask between at least two flip orientations and at least one less all predetermined photomask side orientations, said system comprising:

a. a frame;

b. a robotic arm connected to said frame and configured for computerized controlled transferring said photomask along a photomask transfer axis and within a spatial photomask transfer envelope;

c. a spatial photomask flipper connected to said frame in a predetermined position with respect to said spatial photomask transfer envelope, said spatial photomask flipper comprising:

i. a photomask clamping unit comprising:

1. a double acting photomask clamper providing two opposing clamp motions along a motored clamping axis;

2. two clamping frames attached to said double acting photomask clamper for exercising said opposing clamp motions;

3. multiple clamping points oppositely paired and oppositely attached to respective ones of said two clamping frames for point clamping said photomask;

4. multiple photomask access gates in a number of between one less and all of said predetermined photomask side orientations for accessing along said photomask transfer axis and within said spatial photomask transfer envelope up said number of predetermined photomask side orientations while said photomask being said point clamped and while said photomask clamping unit being spatially rotated into a transfer access orientation, wherein each of said multiple access gates extends in between two adjacent pairs of said oppositely paired clamping points and in between said two clamping frames;

ii. a link arm comprising a first motored rotation axis rotationally holding said photomask clamping unit at a first functional end of said link arm, said first functional end being opposite a second functional end of said link arm;
iii. a base comprising a second motored rotation axis rotationally holding said link arm at said second functional end;
wherein said second motored rotation axis is in a substantial angle with respect to said first motored rotation axis such that said multiple photomask access gates are alternately positioned in said two flip orientations with respect to said photomask transfer axis by a combined motored rotation of said flat photomask around said first motored rotation axis and said link arm around said second motored rotation axis;
d. a digital camera comprising a view field that encompasses said orientation mark while said photomask is point clamped as said and while said photomask is rotated into at least one of said all predetermined photomask side orientations; and
wherein both of said two clamping frames comprise respective apertures such that said camera is in visual contact with said photomask while said photomask is said point clamped and while said photomask clamping unit is in said at least two flip orientations.

24. The system of claim 23, further comprising a computer control for controlling said robotic arm in conjunction with said spatial photomask flipper and in conjunction with an arbitrary initial spatial orientation of said photomask clamped in said photomask clamping unit, said computer control comprising an image processing algorithm for computerized recognizing said arbitrary initial spatial orientation from a digital image taken with said digital camera of said photomask including said orientation mark.

25. The system of claim 24, wherein said image processing algorithm includes a character recognition algorithm.

26. The system of claim 25, wherein said camera consists of a single camera and wherein said digital image consists of a single image.

27. The system of claim 23, wherein said view field encompasses said orientation mark while said photomask is corner clamped as said and while said photomask is rotated into any one of said all predetermined photomask side orientations.

28. The system of claim 23, wherein:
a. said spatial photomask flipper further comprises a transfer access orientation that is an orientation of said photomask clamping unit in which an alternating one of said multiple photomask access gates is facing said transfer axis in either of said at least two flip orientations and encompassing said spatial photomask transfer envelope at least while said two clamping frames are open;
b. said second motored rotation axis is in a substantial angle and a spacing with respect to said first motored rotation axis such that said alternating one photomask access gate is alternately oriented into said at least two flip orientations while in said transfer access orientation by a combined motored rotation of said photomask clamping unit around said first motored rotation axis and said link arm around said second motored rotation axis;
c. said spatial photomask transfer envelope corresponds to the largest projected contours of said photomask while resting on a photomask loader and corresponds to any portion of said photomask loader predetermined to reach within said alternating one photomask access gate; and
d. said photomask transfer axis being symmetric with respect to a top side and bottom side of said photomask while resting on a robotic loading arm, said two opposing clamping motions being substantially symmetric with respect to said first motored rotation axis, and said first motored rotation axis being substantially above said transfer axis such that said photomask is substantially equally raised and lowered with respect to said photomask transfer axis by a lower one of said two clamping frames during either of said at least two flip orientations.

29. The system of claim 28, wherein said robotic arm operates within a loading plane only.

30. The system of claim 23 being part of an optical inspection device.

31. A spatial photomask flipper comprising:
a. a photomask clamping unit comprising:
vii. a double acting photomask clamper providing two opposing clamp motions along a motored clamping axis;
viii. two clamping frames attached to said double acting photomask clamper for exercising said opposing clamp motions;
ix. multiple clamping points oppositely paired and oppositely attached to respective ones of said two clamping frames for point clamping said photomask;
iv. multiple photomask access gates in a number of said up to all predetermined photomask side orientations for accessing along a photomask transfer axis and within a spatial photomask transfer envelope up to all predetermined photomask side orientations while said photomask being said point clamped and while said photomask clamping unit being spatially rotated into a transfer access orientation, wherein each of said multiple access gates extends in between two adjacent pairs of said oppositely paired clamping points and in between said two clamping frames;
b. a link arm comprising a first motored rotation axis rotationally holding said photomask clamping unit at a first functional end of said link arm, said first functional end being opposite a second functional end of said link arm;
c. a base comprising a second motored rotation axis rotationally holding said link arm at said second functional end;
d. a pellicle detection sensor having a detection field coinciding at least with a portion of said pellicle while said photomask is clamped in said photomask clamping unit and while said photomask clamping unit is in said pellicle detection orientation; and
wherein:
a. said transfer access orientation is an orientation of said photomask clamping unit in which an alternating one of said multiple photomask access gates is facing said transfer axis in either of said at least two flip orientations and encompassing said spatial photomask transfer envelope at least while said two clamping frames are open;
b. said second motored rotation axis is in a substantial angle and a spacing with respect to said first motored rotation axis such that said alternating one photomask access gate is alternately oriented into at least two flip orientations and a pellicle detection orientation while in said transfer access orientation by a combined motored rotation of said photomask clamping unit around said first motored rotation axis and said link arm around said second motored rotation axis;
c. said spatial photomask transfer envelope corresponds to the largest projected contours of said photomask including said pellicle while resting on a photomask loader and corresponds to any portion of said photomask loader predetermined to reach within said alternating one photomask access gate; and d. said photomask transfer axis being symmetric with respect to a top side and bottom side of said photomask while resting on a robotic loading arm, said two opposing clamping motions being substantially symmetric with respect to said first motored rotation axis, and said first motored rotation axis being substantially above said transfer axis such that said photomask is substantially equally raised and lowered with respect to said photomask transfer axis by a lower one of said two clamping frames during either of said at least two flip orientations.

32. The spatial photomask flipper of claim 31, wherein said pellicle detection sensor is a digital camera and said detection field is a view field of said digital camera.

33. A system for automatically detecting a pellicle and spatially rotating an orientation marked photomask including said pellicle, said system comprising:
  a. a frame;
  b. a robotic arm connected to said frame and configured for computerized controlled transferring said photomask along a photomask transfer axis and within a spatial photomask transfer envelope;
  c. a spatial photomask flipper connected to said frame in a predetermined position with respect to said spatial photomask transfer envelope, said spatial photomask flipper comprising:
    i. a photomask clamping unit comprising:
      5. a double acting photomask clamper providing two opposing clamp motions along a motored clamping axis;
      6. two clamping frames attached to said double acting photomask clamper for exercising said opposing clamp motions;
      7. multiple clamping points oppositely paired and oppositely attached to respective ones of said two clamping frames for point clamping said photomask;
      8. multiple photomask access gates in a number of between one less and all of said predetermined photomask side orientations for accessing along said photomask transfer axis and within said spatial photomask transfer envelope up to said number of predetermined photomask side orientations while said photomask being said point clamped and while said photomask clamping unit being spatially rotated into a transfer access orientation;
    ii. a link arm comprising a first motored rotation axis rotationally holding said photomask clamping unit at a first functional end of said link arm, said first functional end being opposite a second functional end of said link arm;
    iii. a base comprising a second motored rotation axis rotationally holding said link arm at said second functional end;
    wherein said second motored rotation axis is in a substantial angle with respect to said first motored rotation axis such that said multiple photomask access gates are alternately positioned in said two flip orientations with respect to said photomask transfer axis by a combined motored rotation of said flat photomask around said first motored rotation axis and said link arm around said second motored rotation axis; and
  d. a pellicle detection sensor having a detection field coinciding at least with a portion of said pellicle while said photomask is clamped in said photomask clamping unit and while said photomask clamping unit is in said pellicle detection orientation.

34. The system of claim 33, further comprising a computer control for controlling said robotic arm and said spatial photomask flipper and said pellicle detection sensor, said computer control comprising an pellicle detection algorithm for computerized recognizing said pellicle from a pellicle recognition signal generated by said pellicle detection sensor while said photomask clamping unit is in said pellicle detection orientation.

35. The system of claim 34, wherein said pellicle detection sensor is a digital camera, wherein said detection field is a view field of said digital camera and wherein said computer control comprises a pellicle recognition algorithm for processing said pellicle recognition signal from a digital image taken by said digital camera at least from a portion of said pellicle while said photomask clamping unit is in said pellicle detection orientation.

36. The system of claim 34, wherein said system is part of an optical inspection device.

37. The system of claim 36, wherein said optical inspection device comprises a through-pellicle measurement procedure, wherein said through-pellicle measurement procedure is initiated by said computer control in conjunction with said pellicle recognition signal.

\* \* \* \* \*